United States Patent
Hsu

(10) Patent No.: US 12,451,899 B2
(45) Date of Patent: Oct. 21, 2025

(54) DIGITAL DC-DC CONTROLLER

(71) Applicant: Chenjun Hsu, Miaoli County (TW)

(72) Inventor: Chenjun Hsu, Miaoli County (TW)

( * ) Notice: Subject to any disclaimer, the term of this patent is extended or adjusted under 35 U.S.C. 154(b) by 239 days.

(21) Appl. No.: 18/341,237

(22) Filed: Jun. 26, 2023

(65) Prior Publication Data

US 2024/0429936 A1  Dec. 26, 2024

(51) Int. Cl.
| | |
|---|---|
| H03M 1/50 | (2006.01) |
| H02M 1/00 | (2007.01) |
| H02M 1/088 | (2006.01) |
| H02M 3/157 | (2006.01) |
| H03K 7/08 | (2006.01) |
| H03M 1/08 | (2006.01) |
| H03M 1/12 | (2006.01) |

(52) U.S. Cl.
CPC ......... *H03M 1/504* (2013.01); *H02M 1/0003* (2021.05); *H02M 1/088* (2013.01); *H02M 3/157* (2013.01); *H03K 7/08* (2013.01); *H03M 1/0863* (2013.01); *H03M 1/12* (2013.01); *H03M 1/1215* (2013.01); *H03M 1/1255* (2013.01)

(58) Field of Classification Search
CPC .. H03M 1/504; H03M 1/0863; H03M 1/1215; H03M 1/1255; H03M 1/12; H02M 3/157; H02M 1/0003; H02M 1/088; H03K 7/08
USPC ....................................................... 341/157
See application file for complete search history.

(56) References Cited

U.S. PATENT DOCUMENTS 7,173,403 B1 *  2/2007  Chen ..................... H02M 3/157
                                                        323/282
10,177,654 B1 *  1/2019  Chang ..................... H03K 5/24

OTHER PUBLICATIONS

S.J. Kim, R. Nandwana, Q. Khan, R. Pilawa Podgurski, and P. Hanumolu, "A 1.8V 30 to 70MHz 87% peak efficiency 0.32mm2 4 phase time based buck converter consuming 3μA/MHz quiescent current in 65nm CMOS," in IEEE Int. Solid State Circuits Conf. (ISSCC) Dig. Tech. Papers , Feb. 2015, pp. 216 217.

* cited by examiner

*Primary Examiner* — Khai M Nguyen
(74) *Attorney, Agent, or Firm* — WPAT, P.C.; Anthony King

(57) ABSTRACT

The present application provides an all-digital multi-phase DC-DC controller. The digital DC-DC controller includes time-based analog-to-digital converters (ADCs) for converting analog voltage signals into digital-domain signals so as to benefit from gate length scaling without limited by the low voltage swing. Also, the DC-DC controller further includes a digital control circuit and a time-based modulator. The digital control circuit can control the time-based modulator in a digital domain, thereby reducing the affection caused by process, voltage and temperature (PVT) variation. Also, the time-based modulator can adjust the timing of the PWM signals and avoid the performance degradation caused by circuit mismatch. Since the digital control circuit can be fully synthesizable, it allows implementations in all kinds of digital CMOS processes with a small chip area.

20 Claims, 9 Drawing Sheets

DIGITAL DC-DC CONTROLLER

TECHNICAL FIELD

The present disclosure relates to a DC-DC controller, and more particularly, to an all-digital multi-phase DC-DC controller.

DISCUSSION OF THE BACKGROUND

Multi-phase DC-DC converter that satisfies a requirement of high load currents at low voltages has the following advantages: small form factor, high converter bandwidth, fast transient and low ripple. However, the multi-phase converter has difficulty in improving its efficiency. Thus, how to develop a DC-DC converter that can have higher efficiency has become an issue to be solved.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a DC-DC controller configured to generate N pulse-width modulation (PWM) signals for converting an input voltage to an output voltage targeting at a reference voltage, wherein N is an integer greater than 1. The DC-DC controller includes a first voltage-to-time converter (VTC), a second VTC, a third VTC, a digital control circuit, a sequential phased signal generator (SPSG), and a time-based modulator. The first VTC is configured to generate a first time-domain signal corresponding to the input voltage. The second VTC is configured to generate a second time-domain signal corresponding to the output voltage. The third VTC is configured to generate a third time-domain signal corresponding to a reference voltage. The digital control circuit includes a multiplexer selector, a first time-to-digital converter (TDC), a second TDC, a sign extractor, and a first successive approximation register (SAR) controller. The multiplexer selector is configured to determine a voltage interval of the reference voltage according to the first time-domain signal and the third time-domain signal, and accordingly generate N interval indication signals that indicate a time interval in which a falling edge is located for each of the N PWM signals. The first TDC is coupled to the second VTC, and is configured to generate a first digital-domain signal corresponding to the second time-domain signal. The second TDC is coupled to the third VTC, and is configured to generate a second digital-domain signal corresponding to the third time-domain signal. The sign extractor is configured to generate a comparison code indicating a relation between the output voltage and the reference voltage according to the first digital-domain signal and the second digital-domain signal. The first SAR controller is configured to generate a first control code according to the comparison code. The SPSG is configured to generate N phased signals, and the N phased signals have duty cycles of same widths and frequencies of the N phased signals are (1/N) times a frequency of the third time-domain signal. The time-based modulator is configured to adjust the duty cycles of the N phased signals to generate the N PWM signals according to the N interval indication signals and the first control code.

Another aspect of the present disclosure provides a time-based modulator for adjusting duty cycles of N phased signals to generate N pulse-width modulation (PWM) signals, wherein N is an integer greater than 1, and the duty cycles of the N phased signals have same widths. The time-based modulator includes an input duty selector, at least one digital-to-time converters (DTC), and an output duty selector. The input duty selector is configured to generate N pulse signals according to the N phased signals and N interval indication signals, and combine the N pulse signals into a first combined pulse signal. The at least one DTC is coupled to the input duty selector, and is configured to adjust timings of the first combined pulse signal to generate a second combined pulse signal according to at least one control code. The output duty selector is coupled to the at least one DTC, and is configured to generate the N PWM signals according to the second combined pulse signal and the N interval indication signals. The N rising edges of the N PWM signals are determined by the N phased signals, and the N falling edges of the N PWM signals are determined by the second combined pulse signal generated by the at least one DTCs.

Another aspect of the present disclosure provides an analog-to-digital converter (ADC) for converting a voltage-domain signal into a digital-domain signal. The ADC includes a voltage-to-time converter (VTC) and a time-to-digital converter (TDC). The VTC is configured to receive the voltage-domain signal and generate a time-domain signal corresponding to the voltage-domain signal. The TDC is coupled to the VTC, and is configured to generate the digital-domain signal that correlates to the time-domain signal received from the VTC.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
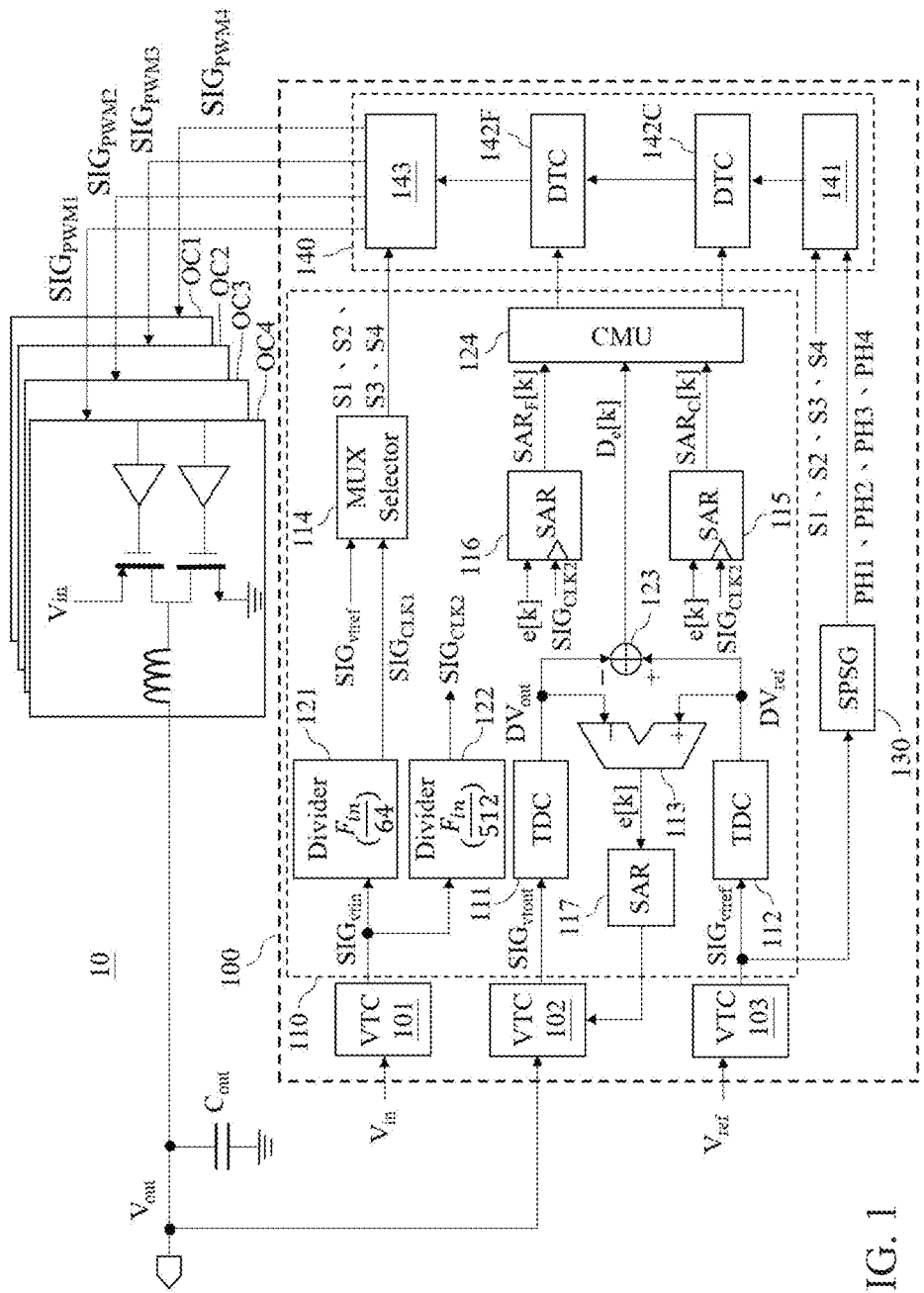
FIG. 1 is a schematic diagram of a DC-DC controller in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Please refer to FIG. 1. FIG. 1 is a schematic diagram of a DC-DC controller 100 in accordance with some embodiments of the present disclosure. In the present embodiment, the DC-DC controller 100 can be adopted in an N-phase DC-DC converter 10, where N is an integer greater than 1. Herein after, for the brevity of explanation, N can be 4; however, the present disclosure is not limited thereto. In such case, the DC-DC converter 10 includes output channels OC1 to OC4 and an output capacitor Cour. Each of the output channels OC1 to OC4 includes drivers, switches, and inductors. The DC-DC controller 100 can generate PWM signals $SIG_{PWM1}$ to $SIG_{PWM4}$ for controlling the output channels OC1 to OC4 in different phases so as to convert an input voltage $V_{in}$ to an output voltage $V_{out}$ that targets at a reference voltage $V_{ref}$.

In some embodiments, the DC-DC controller 100 can be a buck controller, a boost controller, or a buck-boost controller. However, the present disclosure is not limited thereto. Furthermore, in some embodiments, the targeted reference voltage $V_{ref}$ may vary within a wide range during operations according to the system needs, and thus, the output voltage $V_{out}$ may also change accordingly.

The DC-DC controller 100 may include a first voltage-to-time converter (VTC) 101, a second VTC 102, a third VTC 103, a digital control circuit 110, a sequential phased signal generator (SPSG) 130, and a time-based modulator 140.

As shown in FIG. 1, the first VTC 101 can generate a time-domain signal SIG tin corresponding to the input voltage $V_{in}$. The second VTC 102 can generate a time-domain signal SIG, tout corresponding to the output voltage $V_{out}$. The VTC 103 can generate a time-domain signal $SIG_{vtref}$ corresponding to the reference voltage $V_{ref}$.

In some embodiments, the VTCs 101, 102 and 103 may convert voltage-domain signals (e.g., the input voltage $V_{in}$, the output voltage $V_{out}$ and the reference voltage $V_{ref}$) into time-domain signals (e.g., the time-domain signals $SIG_{vtin}$, $SIG_{vtout}$, and $SIG_{vtref}$) having frequencies corresponding to the voltage-domain signals. For example, as the voltage-domain signal becomes larger, the VTCs 101, 102, and 103 may correspondingly generate the time-domain signals with higher frequencies. However, the present disclosure is not limited thereto.

The digital control circuit 110 may further convert the time-domain signals into digital-domain signals, so that the DC-DC controller 100 can compare those voltage-domain signals, such as the output voltage $V_{out}$ and the reference voltage $V_{ref}$, in a digital domain and control the duty cycles of the PWM signals $SIG_{PWM1}$ to $SIG_{PWM4}$ accordingly. Since the DC-DC controller 100 can operate in the digital domain, it can preferably benefit from gate length scaling more than conventional analog DC-DC controllers.

It may also be noted that, due to the gate length scaling, the voltage value of the power supply usually have a lower signal swing, which reduces the signal-to-noise ratio (SNR) for the conventional analog-to-digital converter (ADC). Especially when the supply voltage is reduced to be lower than 1V or even lower, it becomes even more challenging to improve the performance of the ADC. In addition, the low voltage complicates the circuit design of the ADC, since it requires a finer sampling resolution. To avoid such difficulties encountered by the conventional ADC, the DC-DC controller 100 adopts the VTCs 101, 102 and 103 to convert the voltage-domain signals to time-domain signals since the time resolution can be improved even if the supply voltage is reduced. In such case, the time-domain signals can be further converted to digital-domain signals by time-to-digital converters easily, as a result, the time-based analog-to-digital conversion can be achieved without being limited by the low voltage swing.

In the present embodiment, the time-domain signal $SIG_{vtref}$ generated by the VTC 103 according to the reference voltage $V_{ref}$ can be adopted as the basic signal for generating the PWM signals $SIG_{PWM1}$ to $SIG_{PWM4}$. To be more specific, the SPSG 130 can generate 4 phased signals PH1 to PH4 according to the time-domain signal $SIG_{vtref}$. The phased signals PH1 to PH4 have same frequencies which are 1/N times the frequency of the time-domain signal $SIG_{vtref}$ (i.e., ¼ times the frequency of the time-domain signal $SIG_{vtref}$), and have duty cycles of same widths.

Figure 2:
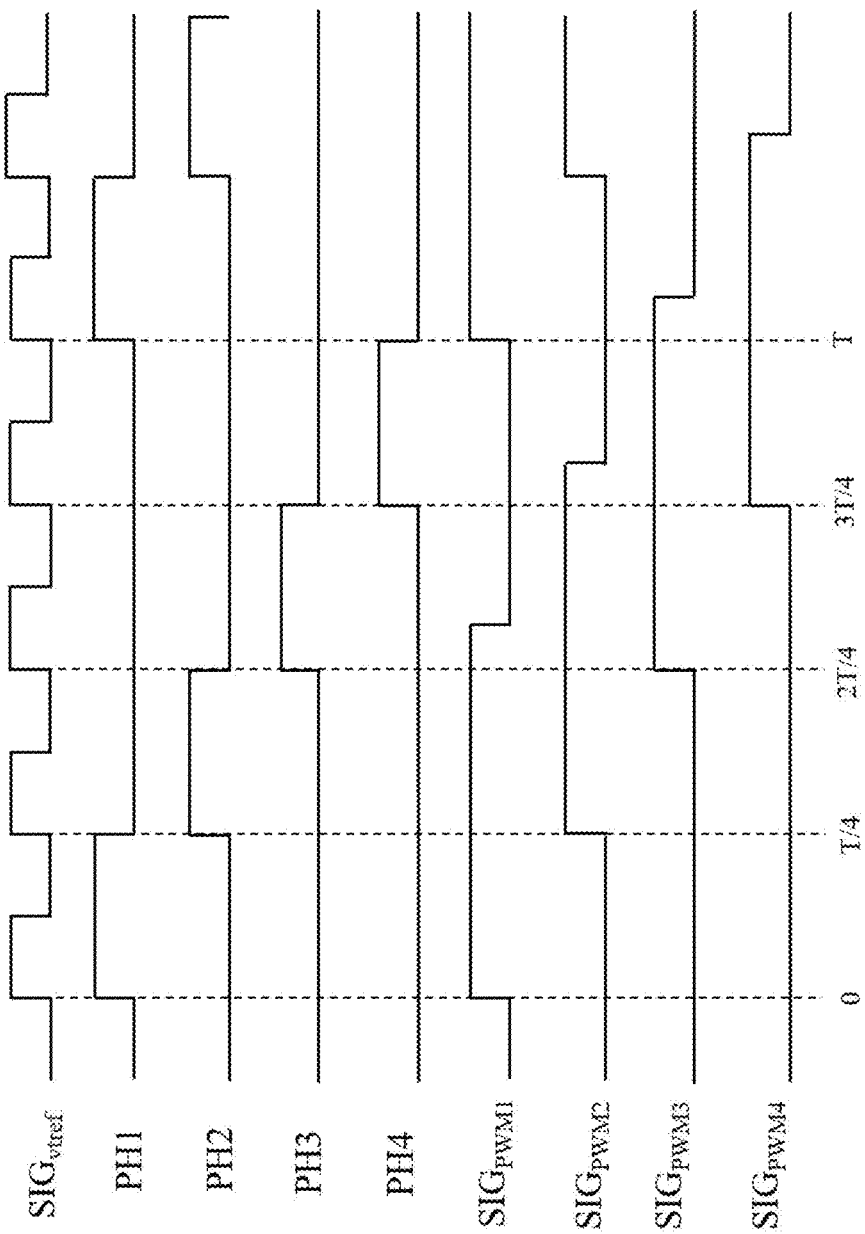
FIG. 2 is a timing diagram of the SPSG in FIG. 1 in accordance with some embodiments of the present disclosure.

FIG. 2 is a timing diagram of a SPSG 130 in accordance with some embodiments of the present disclosure. In the present embodiment, the SPSG 130 can generate four phased signals PH1, PH2, PH3 and PH4 according to the time-domain signal $SIG_{vtref}$ generated based to the reference voltage $V_{ref}$.

Figure 3:
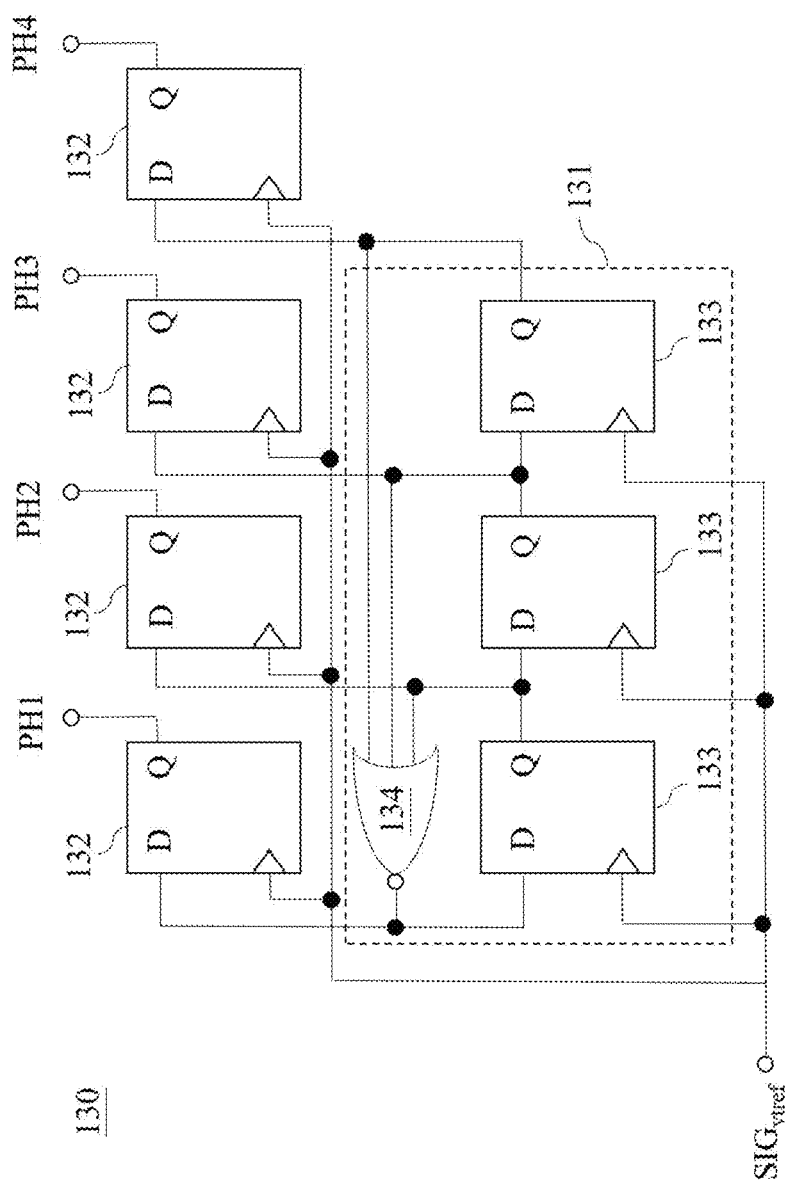
FIG. 3 is a schematic diagram of the SPSG in FIG. 1 in accordance with some embodiments of the present disclosure.

FIG. 3 is a schematic diagram of the SPSG 130 in accordance with some embodiments of the present disclosure. As shown in FIG. 3, the SPSG 130 may include a phased signal generator (PSG) 131 and N D flip-flops (DFFs) 132 (i.e., four DFFs 132 for N=4). The PSG 131 may include (N−1) DFFs 133 (i.e., three DFFs 133 for N=4) and a NOR gate 134.

In the PSG 131, each of the DFFs 133 includes a clock terminal configured to receive the time-domain signal $SIG_{vtref}$, a data terminal, and an output terminal. The output terminal of a $M^{th}$ DFF 133 is coupled to the data terminal of the $(M+1)^{th}$ DFF 133, where M is an integer smaller than (N−1). For example, the output terminal of the $1^{st}$ DFF 133 (i.e., the leftmost DFF 133) is coupled to the data terminal of the $2^{nd}$ DFF 133, and the output terminal of the $2^{nd}$ DFF 133 is coupled to the data terminal of the $3^{rd}$ DFF 133.

The NOR gate 134 in the PSG 131 may include (N−1) input terminals coupled to the (N−1) output terminals of the (N−1) DFFs 133, and an output terminal coupled to the data terminal of a $1^{st}$ DFF 133.

In addition, the SPSG 130 further includes the N DFFs 132 used to prevent combinational logic error due to noise. The N DFFs 132 are configured to output the phased signals PH1 to PH4. Each of the N DFFs 132 may include a clock terminal configured to receive the time-domain signal $SIG_{vtref}$, a data terminal, and an output terminal.

As shown in FIG. 3, the data terminal of a $K^{th}$ DFF 132 is coupled to the data terminal of the $K^{th}$ DFF 133 in the PSG 131, where K is an integer smaller than N. For example, the data terminal of the $1^{st}$ DFF 132 is coupled to the data terminal of the $1^{st}$ stage DFF 133, and the data terminal of the $2^{nd}$ DFF 132 is coupled to the data terminal of the $2^{nd}$ DFF 133. Also, the data terminal of $N^{th}$ DFF 132 (i.e., the last DFF 133) is coupled to the output terminal of $(N−1)^{th}$ DFF 133 (i.e., the last DFF 133) in the PSG 131. The output terminals of the N DFFs 132 can output the phased signals PH1 to PH4 respectively.

In the present embodiment, for N=4, each of the 4 phased signals PH1 to PH4 has a frequency of a quarter (i.e., 1/N) of the frequency $F_{ref}$ of the time-domain signal $SIG_{vtref}$. That is, if T represents a full period of the time-domain signal $SIG_{vtref}$ (i.e., T=1/$F_{ref}$), the phased signal PH1 would have logic high voltage within the duration of 0 to T/4, the phased signal PH2 would have the logic high voltage within the duration of T/4 to T/2, the phased signal PH3 would have the logic high voltage within the duration of T/2 to 3T/4, and the last phased signal PH4 would have the logic high voltage within the duration of 3T/4 to T. That is, as shown in FIG. 2, each of the phased signals PH1 to PH4 has a duty cycle of 25%.

In the present embodiment, the timings of rising edges of the phased signals PH1 to PH4 can be adopted to determine the timings of rising edges of the PWM signals $SIG_{PWM1}$ to $SIG_{PWM4}$ respectively, while the timings of falling edges of the PWM signals $SIG_{PWM1}$ to $SIG_{PWM4}$ can be determined by the time-based modulator 140 according to pulse signals corresponding to the phased signals PH1 to PH4. That is, in the present embodiment, by determining the timings of the rising edges and the falling edges, the waveforms of the PWM signals $SIG_{PWM1}$ to $SIG_{PWM4}$ that allow the output voltage $V_{out}$ to approach the reference voltage $V_{ref}$ can be determined.

Figure 4:
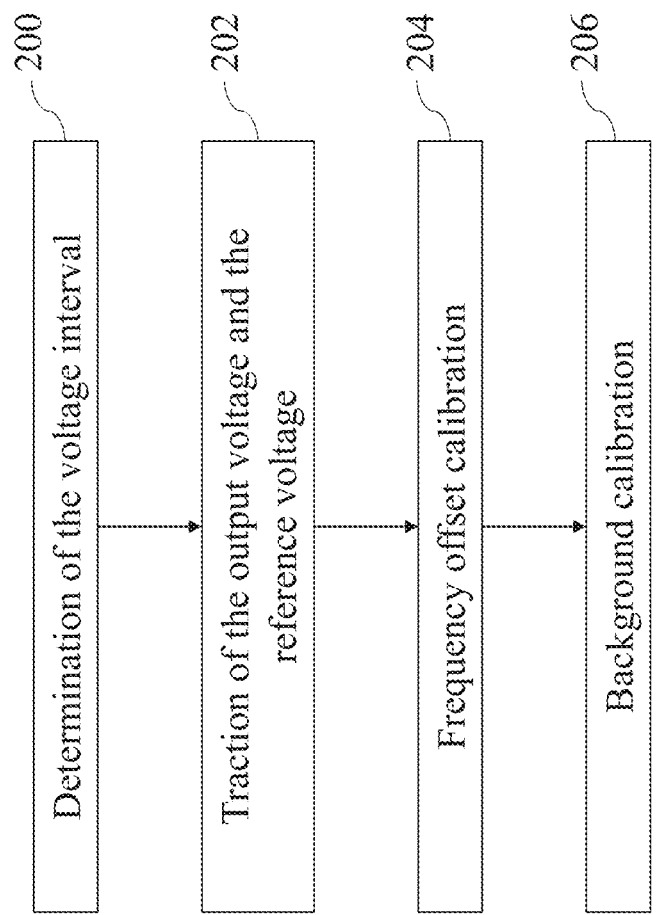
FIG. 4 is a process for obtaining the PWM signals in accordance with some embodiments of the present disclosure.

FIG. 4 is a process 20 for obtaining the PWM signals $SIG_{PWM1}$ to $SIG_{PWM4}$ in accordance with some embodiments of the present disclosure. As shown in FIG. 4, the process 20 can include four procedures 200, 202, 204, and 206.

In the present embodiment, the multiplexer selector 114 can determine the voltage interval of the reference voltage $V_{ref}$ in comparison to the input voltage $V_{in}$ in procedure 200. As a result, time intervals where the falling edges of the PWM signals $SIG_{PWM1}$ to $SIG_{PWM4}$ should locate can be determined by the time-based modulator 140 in procedure 202.

As shown in FIG. 2, each period of the phased signals PH1 to PH4 can be divided into four equal time intervals. For example, there are four time intervals in the period of the phased signal PH1: 0 to T/4, T/4 to 2T/4, 2T/4 to 3T/4, and 3T/4 to T. Correspondingly, the input voltage $V_{in}$ can be divided into four equal voltage intervals. In such case, if the input voltage $V_{in}$ is 3.3V, then the voltages 0.825V, 1.65V, and 2.475V can be adopted to define the four voltage intervals between 0V and 3.3V.

For example, if the reference voltage $V_{ref}$ is greater than 2.475V (3/4 of 3.3V), it would imply that the reference voltage $V_{ref}$ is rather close to the input voltage $V_{in}$, and thus, the PWM signal $SIG_{PWM1}$ to $SIG_{PWM4}$ should also have duty cycles greater than 75% so as to keep charging the inductors for a longer period of time. Accordingly, the falling edge of the PWM signal $SIG_{PWM1}$ should be at a time point somewhere in the fourth time interval between 3T/4 and T. Alternatively, if the reference voltage $V_{ref}$ is smaller than 0.825V, it would imply that the reference voltage $V_{ref}$ is smaller than a quarter of the input voltage $V_{in}$, and thus, the falling edge of the PWM signal $SIG_{PWM1}$ should be at a time point somewhere in the first interval between 0 and T/4. The same principles can be applied when the reference voltage $V_{ref}$ is between 0.825V and 1.65V or between 1.65V and 2.475V.

As shown in FIG. 1, the digital control circuit 110 includes a first divider 121 and a multiplexer selector 114. The first divider 121 can be coupled to the first VTC 101, and may be configured to generate a first clock signal $SIG_{CLK1}$ by dividing the time-domain signal $SIG_{vtin}$ by a first number (e.g., 64). In some embodiments, the first divider 121 may be implemented with a counter. However, the present disclosure is not limited thereto.

The multiplexer selector 114 can receive the time-domain signal $SIG_{vtref}$ and the first clock signal $SIG_{CLK1}$ for determining the voltage interval of the reference voltage $V_{ref}$, and generate interval indication signals S1 to SN (N=4) for indicating the time intervals in which the falling edges of the PWM signals $SIG_{PWM1}$ to $SIG_{PWMN}$ locate.

In some embodiments, the voltage interval can be determined by using a counter to count how many pulses of the time-domain signal $SIG_{vtref}$ that have passed by during a fixed time measured by the first clock signal $SIG_{CLK1}$. Since the VTC 103 has convert the reference voltage $V_{ref}$ into the time-domain signal $SIG_{vtref}$ having a frequency proportional to the reference voltage $V_{ref}$, the number of pulses that have passed by during a fixed time can reflect the reference voltage $V_{ref}$, and thus, can be used to determine the voltage interval.

For example, if the number of pulses is 512 when the reference voltage $V_{ref}$ is equal to the input voltage $V_{in}$, then the number 128, 256, and 384 would be used to determine the voltage interval of the reference voltage $V_{ref}$. In such case, when the number of pulses is smaller than 128, the multiplexer selector 114 may determine the voltage interval of the reference voltage $V_{ref}$ is at an interval of the first quarter, and thus the falling edge of the PWM signal $SIG_{PWM1}$ should locate at the time interval between 0 and T/4. When the number of pulses is greater than 128 and smaller than 256, the multiplexer selector 114 may determine the voltage interval of the reference voltage $V_{ref}$ is at an interval of the second quarter, and thus the falling edge of the PWM signal $SIG_{PWM1}$ should locate at the time interval between T/4 and 2T/4. Also, when the number of pulses is greater than 256 and smaller than 384, the multiplexer selector 114 may determine the voltage interval of the reference voltage $V_{ref}$ is at an interval of the third quarter, and thus the falling edge of the PWM signal $SIG_{PWM1}$ should locate at the time interval between 2T/4 and 3T/4. When the number of pulses is greater than 384, the multiplexer selector 114 may determine the voltage interval of the reference voltage $V_{ref}$ is at an interval of the fourth quarter, and thus the falling edge of the PWM signal $SIG_{PWM1}$ should locate at the time interval between 3T/4 and T. In the present embodiment, since the number of pulses may be greater than 512, the counter should have a precision greater than 9 bits, for example, but not limited to 10 bits. However, the present disclosure is not limited thereto. In some other embodiments, the numbers 128, 256, 384, and 512 used for determining the time intervals may be changed according to the design, and the precision of the counter may also be altered accordingly.

Furthermore, to allow the time-based modulator 140 to select the voltage interval in a simpler manner, the multiplexer selector 114 can generate interval indication signals S1 to S4 that correspond to the 4 PWM signal $SIG_{PWM1}$ to $SIG_{PWM4}$ according to the number of pulses counted in the fixed time period.

In the present embodiment, each of the interval indication signals S1 to S4 may be represented by 2 bits. For example, if the voltage interval of the reference voltage $V_{ref}$ implies that the falling edge of the PWM signal $SIG_{PWM1}$ locates at the interval between 0 and T/4 (which also overlaps with the pulse of the phased signal PH1), the interval indication signal S1 may be "00", if the voltage interval of the reference voltage $V_{ref}$ implies that the falling edge of the PWM signal $SIG_{PWM1}$ locates at the interval between T/4 and 2T/4 (which also overlaps with the pulse of the phased signal PH2), the interval indication signal S1 may be "01", and so on.

Furthermore, since the PWM signal $SIG_{PWM1}$ to $SIG_{PWM4}$ all have the same pulse widths, once the voltage interval of reference voltage $V_{ref}$ is determined, the interval indication signal S1 can be determined, and the rest of interval indication signals S2 to S4 can also be determined accordingly. In the present embodiment, the interval indication signals S1 to S4 can be arranged in a sequential manner. For example, if the interval indication signals S1 is "00", then the interval indication signals S2, S3, and S4 would be "01", "10", and "11" respectively. Similarly, if the interval indication signals S1 is "10", then the interval indication signals S2, S3, and S4 would be "11", "00", and "01" respectively.

According to the interval indication signals generated by the multiplexer selector 114, the time-based modulator 140 can locate the falling edges of the PWM signals $SIG_{PWM1}$ to $SIG_{PWM4}$ roughly.

Afterward, in procedure 202, the falling edges of the PWM signals $SIG_{PWM1}$ to $SIG_{PWM4}$ can be further located more precisely so that the output voltage $V_{out}$ can closely approach to the reference voltage $V_{ref}$, thereby achieving the traction of the output voltage $V_{out}$ and the reference voltage $V_{ref}$.

That is, in the procedure 202, the DC-DC controller 100 aims to adjust the output voltage $V_{out}$ to match the reference voltage $V_{ref}$ so that the output voltage $V_{out}$ can eventually equal to or close enough to the reference voltage $V_{ref}$. To achieve such goal, the digital control circuit 110 may include a first time-to-digital converter (TDC) 111, a second TDC 112, a sign extractor 113, and a first successive approximate register (SAR) controller 115.

In the present embodiment, the first SAR controller 115 may generate control codes according to the relation between the output voltage $V_{out}$ and the reference voltage $V_{ref}$. The control code is used for adjusting (e.g., increasing or decreasing) the falling edges of the PWM signals $SIG_{PWM1}$ to $SIG_{PWM4}$ so as to adjust the duty cycles and match the output voltage $V_{out}$ to the reference voltage $V_{ref}$.

In the present embodiment, the TDC 111 is coupled to the VTC 102, and is configured to generate a digital-domain signal $DV_{out}$ corresponding to the time-domain signal $SIG_{vtout}$ generated by the VTC 102. The TDC 112 is coupled to the VTC 103, and is configured to generate a digital-domain signal $DV_{ref}$ corresponding to the time-domain signal $SIG_{vtref}$ generated by the VTC 103.

In the present embodiment, the TDC 111 may include a counter, and the digital-domain signal $DV_{out}$ can be obtained by counting a number of pulses of the time-domain signal $SIG_{vtout}$ without referring to any clock signals. Similarly, the TDC 112 may include a counter, and the digital-domain signal $DV_{ref}$ can be obtained by counting a number pulses of the time-domain signal $SIG_{vtref}$ without referring to any clock signals. That is, in the present embodiment, the VTC 102 with the TDC 111 or the VTC 103 with the TDC 112 can be seen as a time-based analog-to-digital converter. In such case, the values of the digital-domain signals $DV_{out}$ and $DV_{ref}$ can reflect the output voltage $V_{out}$ and the reference voltage $V_{ref}$ accordingly, and thus, can be used to indicate the relation between the reference voltage $V_{ref}$ and the output voltage $V_{out}$.

The sign extractor 113 is configured to generate a comparison code e[k] for indicating the relation between the output voltage $V_{out}$ and the reference voltage $V_{ref}$ according to the values of the digital-domain signals $DV_{out}$ and $DV_{ref}$. The comparison code e[k] may include only a single bit with a value of 0 or 1, and the single bit can be the sign bit generated by subtracting the value of the digital-domain signal $DV_{out}$ from the value of the digital-domain signal $DV_{ref}$ so as to indicate which of the output voltage $V_{out}$ and the reference voltage $V_{ref}$ is larger.

The first SAR controller 115 is configured to generate a first control code $SAR_C[k]$ for adjusting a timing of the falling edge of each of the PWM signals $SIG_{PWM1}$ to $SIG_{PWM4}$ according to the comparison code e[k]. To be more specific, the first SAR controller 115 may generate a SAR control code $SAR_C[k]$ to increase the duty cycles of the PWM signals when the reference voltage $V_{ref}$ is higher than the output voltage $V_{out}$, and the value of the digital-domain signal $DV_{ref}$ is greater than the value of the digital-domain signal $DV_{out}$ (for example but not limited to, e[k]=0), and generate another SAR control code $SAR_C[k]$ to decrease the duty cycles of the PWM signals when the reference voltage $V_{ref}$ is lower than the output voltage $V_{out}$, and the value of the digital-domain signal $DV_{ref}$ is smaller than the value of the digital-domain signal $DV_{out}$ (for example but not limited to, e[k]=1).

In some embodiments, the digital control circuit 110 may further include a divider 122. The divider 122 may be coupled to the VTC 101, and may be configured to generate a second clock signal $SIG_{CLK2}$ according to the time-domain signal $SIG_{vtin}$. In the present embodiment, the divider 122 can be implemented by a counter, and can generate the second clock signal $SIG_{CLK2}$ by dividing the frequency $F_{in}$ of the time-domain signal $SIG_{vtin}$ by a second number (e.g., 512). That is, the frequency of the second clock signal $SIG_{CLK2}$ can be 1/512 of the time-domain signal $SIG_{vtin}$, and the SAR controller 115 can receive the second clock signal $SIG_{CLK2}$ as its clock signal. In some embodiments, the divider 121 may be reused to generate both the clock signals $SIG_{CLK1}$ and $SIG_{CLK2}$. In such case, the divider 122 can be omitted to reduce the hardware component required by the DC-DC controller 100.

In some embodiments, the digital control circuit 110 may further include a second SAR controller 116. The second SAR controller 116 can generate a finer SAR control code $SAR_F[k]$ to further adjust the falling edges of the PWM signals $SIG_{PWM1}$ to $SIG_{PWM4}$ in a finer manner according to the comparison code e[k], so that the duty cycles of the PWM signals $SIG_{PWM1}$ to $SIG_{PWM4}$ can be adjusted even more precisely. That is, the digital control circuit 110 can adjust the duty cycles of the PWM signals $SIG_{PWM1}$ to $SIG_{PWM4}$ by two-stage adjustments: one coarse adjustment by the SAR controller 115 and one fine adjustment by the SAR controller 116.

For example, after the coarse SAR control code $SAR_C[k]$ is obtained by the first SAR controller 115, the SAR control code $SAR_C[k]$ can be fed to the time-based modulator 140 for adjusting the PWM signals $SIG_{PWM1}$ to $SIG_{PWM4}$ so as to adjust the output voltage $V_{out}$. Afterward, to further obtain the fine SAR control code $SAR_F[k]$, the SAR control code $SAR_C[k]$ can be subtracted by one unit, that is, one least significant bit (LSB). For example, if the control code $SAR_C[k]$ is corresponding to a value of 53, then an updated SAR control code that equals to the control code $SAR_C[k]-1$ (i.e., 52) will be fed to the time-based modulator 140. In such case, the output voltage $V_{out}$ would be decreased accordingly, and the SAR controller 116 can receive the updated comparison code e [k] and generate the fine control code $SAR_F[k]$ according to the updated comparison code e [k]. In the present embodiment, the adjustment unit of time caused by the coarse control code $SAR_C[k]$ is greater than the adjustment unit of time caused by the fine control code $SAR_F[k]$. Furthermore, in some embodiments, the adjustment unit of time caused by the coarse control code $SAR_C[k]$ can be equal to the full adjustment time that can be produced by the fine control code $SAR_F[k]$. Therefore, by adopting the fine control code $SAR_F[k]$, the output voltage $V_{out}$ can be adjusted in a higher resolution. Due to the higher resolution contributed by the SAR controller 116, the limit-cycling behavior of the ADC may be eliminated.

Although the digital control circuit 110 includes two SAR controllers 115 and 116 for adjusting the timing of the PWM signals $SIG_{PWM1}$ to $SIG_{PWM4}$ in different resolutions, the present disclosure is not limited thereto. In some other embodiments, the two-stage adjustments may be achieved by reusing one SAR controller 115 or 116. Furthermore, in some embodiments, only one stage of adjustment may be adopted according to the system needs. In addition, the control code $SAR_C[k]$ and the control code $SAR_F[k]$ may include same numbers of bits. For example, the control code $SAR_C[k]$ and the control code $SAR_F[k]$ may both include 6 bits. However, the present embodiment is not limited thereto. In some embodiments, the bit number of the control code $SAR_C[k]$ can be equal to or different from the bit number of the control code $SAR_F[k]$.

Figure 5:
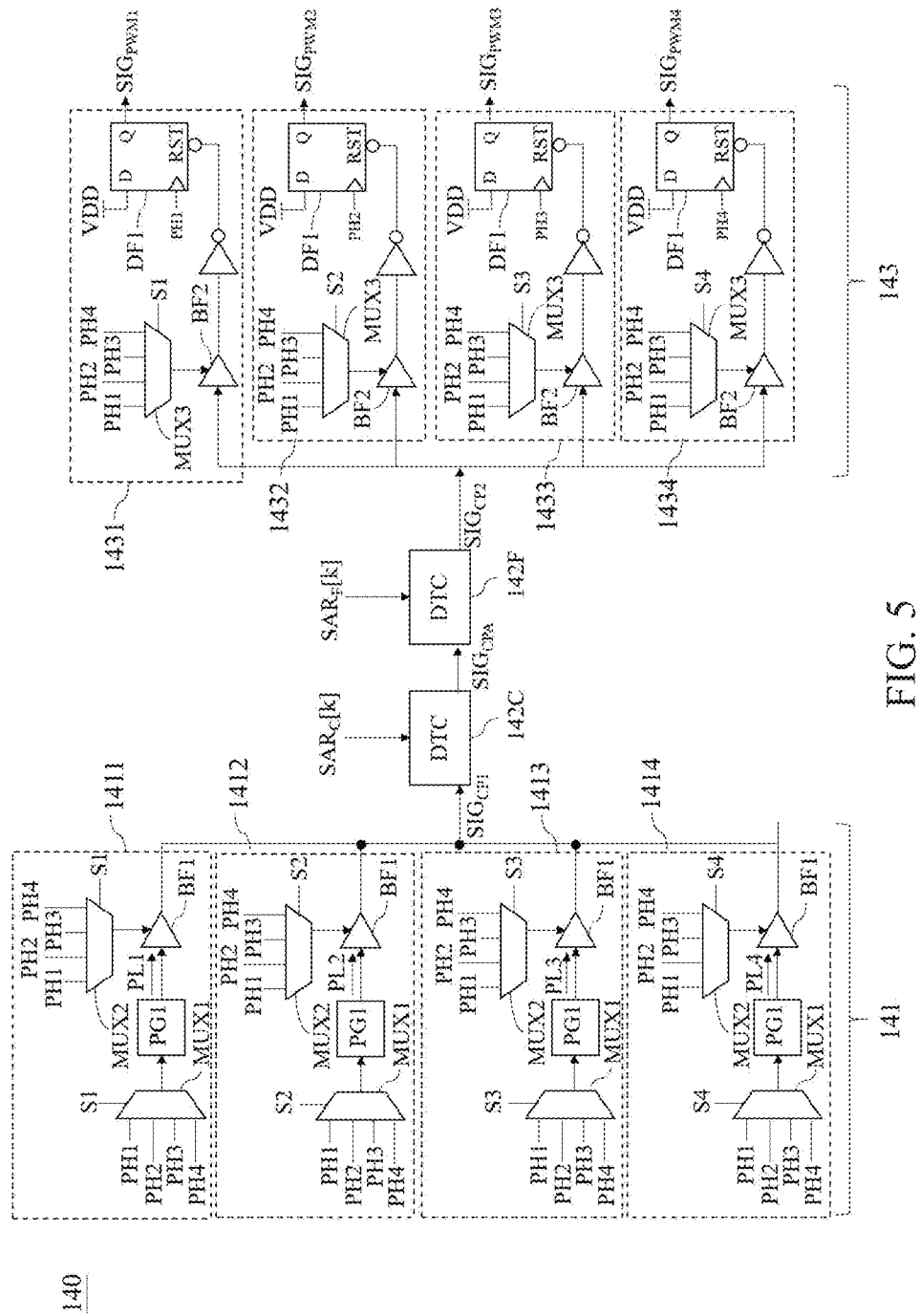
FIG. 5 is a schematic diagram of the time-based modulator in FIG. 1 in accordance with some embodiments of the present disclosure.
Figure 6:
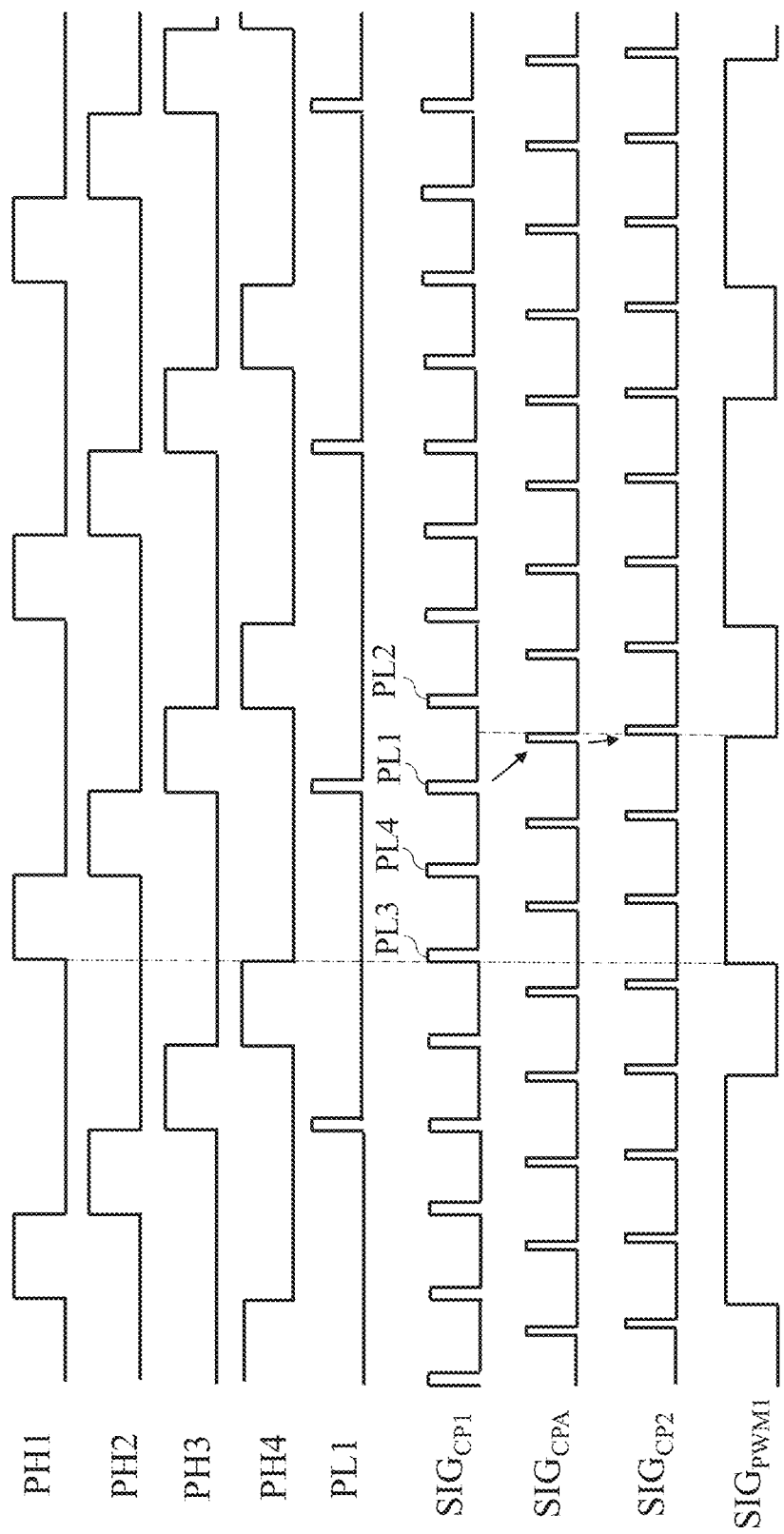
FIG. 6 is a timing diagram of the time-based modulator in FIG. 1 in accordance with some embodiments of the present disclosure.

FIG. 5 is a schematic diagram of the time-based modulator 140 in accordance with some embodiments of the present disclosure, and FIG. 6 is a timing diagram of the time-based modulator 140 in accordance with some embodiments of the present disclosure. The time-based modulator 140 may include an input duty selector 141, digital-to-time converters (DTCs) 142C and 142F, and an output duty selector 143.

The input duty selector 141 may include N input channel units, that is, the input channel units 1411 to 1414. Each of the input channel units 1411 to 1414 includes a multiplexer MUX1, a multiplexer MUX2, a pulse generator PG1, and a buffer BF1.

In the present embodiment, after the multiplexer selector 114 determines the voltage interval and generate the corresponding interval indication signals S1 to S4, the interval indication signals S1 to S4 are outputted to the multiplexers MUX1 and MUX2 of the input channel units 1411 to 1414 respectively so as to generate transparent windows for reusing the DTCs 142C and 142F. In some embodiments, if only one stage of SAR control is adopted for adjustment (i.e., only the coarse SAR controller 115 is adopted), then the DTC 142F may be omitted, and the time-based modulator 140 may include only one DTC.

In the present embodiment, if the interval indication signals S1 to S4 are "10", "11", "00", and "01", then the multiplexer MUX1 of the input channel unit 1411 will select the phased signal PH3, the multiplexer MUX1 of the input channel unit 1412 will select the phased signal PH4, the multiplexer MUX1 of the input channel unit 1413 will select the phased signal PH1, and the multiplexer MUX1 of the input channel unit 1414 will select the phased signal PH2.

The pulse generators PG1 in the input channel units 1411 to 1414 are coupled to the multiplexers MUX1 in the input channel units 1411 to 1414 correspondingly and respectively, and are configured to generate pulse signals PL1 to PL4 corresponding to the phased signals PH1 to PH4. The pulse widths of the pulse signals PL1 to PL4 are shorter than the pulse widths of the phased signal PH1 to PH4. That is, the pulse generators PG1 can shorten the pulse widths of the phased signal PH1 to PH4. Since the pulse signals PL1 to PL4 have shorter pulses and only remain at the logic high voltage in shorter time periods, the power consumption of time-based modulator 140 can be reduced.

Each of the buffers BF1 includes an input terminal configured to receive a pulse signal from the corresponding pulse generator PG1, a control terminal configured to receive the phased signal selected by the corresponding multiplexer MUX2, and an output terminal coupled to an input terminal of the DTC 142C.

In the present embodiment, the multiplexers MUX2 can receive the same interval indication signals S1 to S4 as the multiplexers MUX1, and thus, can generate transparent windows for the pulse signals PL1 to PL4 to pass through the buffers BF1. For example, as shown in FIG. 6, the buffer BF1 of the input channel unit 1411 can output the pulse signal PL1 during the on-time of the phased signal PH3. Similarly the buffer BF1 of the input channel unit 1412 can output the pulse signal PL2 during the on-time of the phased signal PH4, the buffer BF1 of the input channel unit 1413 can output the pulse signal PL3 during the on-time of the phased signal PH1, and the buffer BF1 of the input channel unit 1414 can output the pulse signal PL4 during the on-time of the phased signal PH2. In the present embodiment, an on-time of a signal means a time that the signal remains at the logic high voltage.

As a result, the pulse signals PL1 to PL4 can be combined as a combined pulse signal $SIG_{CP1}$ and processed by the DTCs 142C and 142F. As shown in FIG. 6, according to the combined pulse signal $SIG_{CP1}$ received by the DTC 142C, the DTC 142C can receive a pulse corresponding to the pulse signal PL1 during the on-time of the phased signal PH3. Similarly, the DTC 142C can receive a pulse corresponding to the pulse signal PL2 during the on-time of the phased signal PH4, receive a pulse corresponding to the pulse signal PL3 during the on-time of the phased signal PH1, and receive a pulse corresponding to the pulse signal PL4 during the on-time of the phased signal PH2.

The DTC 142C can adjust the timings of the combined pulse signal $SIG_{CP1}$ to generate another combined pulse signal $SIG_{CP4}$. For example, the DTC 142C can adjust the timing of the pulses of the combined pulse signal $SIG_{CP1}$ according to the coarse SAR control code $SAR_C[k]$. Therefore, the timing of the pulses of the combined pulse signal $SIG_{CP1}$ can be adjusted as shown by the waveform of the combined pulse signal $SIG_{CP4}$ outputted by the DTC 142C. Similarly, The DTC 142F can adjust the timing of the pulses of the combined pulse signal $SIG_{CP4}$ according to the fine SAR control code $SAR_F[k]$. Therefore, the timing of the pulses of the combined pulse signal $SIG_{CP4}$ can be further adjusted as shown by the waveform of the combined pulse signal $SIG_{CP2}$ outputted by the DTC 142F. In such case, the DTCs 142C and 142F can be reused to adjust the pulse signals PL1 to PL4 in different periods of time, thereby reducing the hardware required by the time-based modulator 140 and ensuring the phased signals PH1 to PH4 to be adjusted equivalently.

After the DTCs 142C and 142F adjust the pulses corresponding to the phased signals PH1 to PH4 and generate the combined pulse signal $SIG_{CP2}$, the output duty selector 143 can split the combined pulse signal $SIG_{CP2}$ into the four PWM signals $SIG_{PWM1}$ to $SIG_{PWM4}$.

The output duty selector 143 includes N output channel units, that is, output channel units 1431 to 1434, for generating the PWM signal $SIG_{PWM1}$ to $SIG_{PWM4}$ respectively. Each of the output channel units 1431 to 1434 includes a multiplexer MUX3, a buffer BF2 and a D flip-flop (DFF) DF1.

Each of the multiplexers MUX3 is configured to select a phased signal from the phased signal PH1 to PH4 according to a corresponding one of the interval indication signals S1 to S4.

Each of the buffer BF2 includes an input terminal configured to receive the combined pulse signal $SIG_{CP2}$ adjusted by the DTC 142C and 142F, a control terminal configured to receive the phased signal selected by the multiplexer MUX3, and an output terminal configured to output a portion of the combined pulse signal $SIG_{CP2}$ as a reset signal for the DFF DF1 during the on-time of the phased signal selected by the multiplexer MUX3.

For example, the multiplexer MUX3 of the output channel unit 1431 may select the third phased signal PH3 according to the interval indication signal S1, and thus, the combined pulse signal $SIG_{CP2}$ can only pass through the buffer BF2 during the on-time of the third phased signal PH3 in the output channel unit 1431. Similarly, the multiplexer MUX3 of the output channel unit 1432 may select the fourth phased signal PH4 according to the interval indication signal S2, and thus, the combined pulse signal $SIG_{CP2}$ can only pass through the buffer BF2 during the on-time of the fourth phased signal PH4 in the output channel unit 1432. That is, the multiplexers MUX3 and the buffers BF2 in the output channel units 1431 to 1434 can be used to select the adjusted pulses of the corresponding phased signals PH1 to PH4.

Each of the DFF DF1 in the output channel units 1431 to 1434 includes a data terminal coupled to a logic high voltage VDD, a clock terminal configured to receive a corresponding phased signal, a reset terminal configured to receive the reset signal outputted by the buffer BF2, and an output terminal configured to output the PWM signal.

In such case, the DFFs DF1 can generate the PWM signals $SIG_{PWM1}$ to $SIG_{PWM4}$ that have rising edges determined by the clock signals (i.e., a corresponding one of the phased signals PH1 to PH4) and falling edges determined by the reset signals outputted by the buffer BF2. For example, as shown in FIG. 6, the DFFs DF1 of the output channel unit 1431 can generate the PWM signal $SIG_{PWM1}$ to have rising edges triggered by the rising edges of the phased signal PH1. Also, in the present embodiment, since the reset terminal of the DFF DF1 is active low, an inverter is added to invert the reset signal outputted by the buffer BF2. In such case, when the reset signal that pass through the buffer BF2 in the output channel unit 1431 (i.e., the portion of the combined pulse signal $SIG_{CP2}$ within the on-time of the phased signal PH3) is at the logic high voltage, the DFFs DF1 of the output channel unit 1431 will be reset and will pull down the PWM signal $SIG_{PWM1}$, thereby causing the falling edges of the PWM signal $SIG_{PWM1}$. However, the present disclosure is not limited thereto. In some other embodiment, according to the design and the system needs, the reset terminal of the DFF DF1 may be active high, and the inverter may be omitted.

In the present embodiment, since the time-based modulator 140 can generate the four phased PWM signals $SIG_{PWM1}$ to $SIG_{PWM4}$ by utilizing one same loop rather than utilizing four independent loops, the issue caused by circuit mismatch among different loop circuits can be avoided. Also, by controlling the PWM signals $SIG_{PWM1}$ to $SIG_{PWM4}$ by utilizing digital control, the unwanted effects caused by process, voltage and temperature (PVT) variations can also be eliminated.

Furthermore, in some embodiments, the time-based modulator 140 may also be adopted by other application for signals modulation.

After the output voltage $V_{out}$ has approached to the reference voltage $V_{ref}$, the DC-DC controller 100 can perform procedure 204 to calibrate the frequency offset between the frequencies $F_{out}$ of the time-domain signal $SIG_{vout}$ and $F_{ref}$ of the time-domain signal $SIG_{vtref}$ by means of a frequency-locked loop (FLL) technique between the VTC 102 and the VTC 103. In the present embodiment, the digital control circuit 110 may further includes a SAR controller 117 for generating a control code according to the comparison code e[k] obtained by the sign extractor 113. The control code can be outputted to the VTC 102 for controlling the capacitor banks in the VTC 102. By adjusting the capacitor banks, the frequency of the VTC 102 can be adjusted. Therefore, the FLL can be achieved, and the frequency $F_{out}$ can be equal to the frequency $F_{ref}$ when the output voltage $V_{out}$ is equal to the reference voltage $V_{ref}$.

In the present embodiment, the SAR controller 117 is adopted to generate the control code for controlling at least one capacitor bank of the VTC 102; however, the present embodiment is not limited thereto. In some embodiments, the SAR controller 115 may be reused to perform the frequency offset calibration, and the SAR controller 117 can be omitted so as to reduce the hardware components required by the DC-DC controller 100.

After the frequency offset calibration is completed, that is, when the frequency $F_{out}$ equals to the frequency $F_{ref}$, procedure 206 can be conducted to perform the background calibration so that the output voltage $V_{out}$ can be regulated not only in a steady state but also during a transient state. In the present embodiment, the digital control circuit 110 can conduct the background calibration by adjusting the control codes inputted to DTCs 142C and 142F of the time-based modulator 140 for fast transient response and load regulation.

As shown in FIG. 1, the digital control circuit 110 may further include an adder 123, and a code modification unit (CMU) 124. The adder 123 may be coupled to the first TDC 111 and the second TDC 112, and may be configured to generate the digital code $D_e[k]$ by subtracting the value of the digital-domain signal $DV_{out}$ from the value of the digital-domain signal $DV_{ref}$, and the CMU 124 can conduct the background calibration by modifying modify the control-code codes received by the DTCs 142C and 142F of the time-based modulator 140 according to the digital code $D_e[k]$ so as to regulate the output voltage $V_{out}$ in at least one of the steady state and the transient state. However, it should be noticed that, the CMU 124 may simply pass the control codes $SAR_C[k]$ and $SAR_F[k]$ to the DTCs 142C and 142F during the traction of the output voltage $V_{out}$ and the reference voltage $V_{ref}$, that is, during the procedure 202, although the SAR controllers 115 and 116 may change the control codes $SAR_C[k]$ and $SAR_F[k]$ so as to have the output voltage $V_{out}$ approach the reference voltage $V_{ref}$, the CMU may not further change the control codes $SAR_C[k]$ and $SAR_F[k]$ during the procedure 202.

For example, after the control codes $SAR_C[k]$ and $SAR_F[k]$ are obtained in at least one of the steady state and the transient state, if the CMU 124 detects that the digital code $D_e[k]$ is greater than a first threshold, (e.g. 2), which means that the reference voltage $V_{ref}$ is higher than the output voltage $V_{out}$, the CMU 124 may increase the control codes received by the time-based modulator 140 by adding the digital code $D_e[k]$ to the control code $SAR_C[k]$ and/or control code $SAR_F[k]$ so that the DTCs 142C and/or 142F will further increase the duty cycles of the PWM signals $SIG_{PWM1}$ to $SIG_{PWM4}$ so as to increase the output voltage $V_{out}$. Also, if the digital code $D_e[k]$ is smaller than a second threshold, (e.g. −2), which means that the reference voltage $V_{ref}$ is lower than the output voltage $V_{out}$, the CMU 124 may decrease the control codes received by the time-based modulator 140 by adding the digital code $D_e[k]$ to the control codes $SAR_C[k]$ and/or $SAR_F[k]$ (i.e., subtracting the absolute value of the digital code $D_e[k]$ from the control codes $SAR_C[k]$ and/or $SAR_F[k]$) so as to decrease the duty cycles of the PWM signals $SIG_{PWM1}$ to $SIG_{PWM4}$ and decrease the output voltage $V_{out}$.

Furthermore, as aforementioned, the combination of the VTC 102 and the TDC 111 and the combination of the VTC 103 and the TDC 112 may each be seen as a time-based ADC. In some embodiments, in addition to the DC-DC controller 100, such time-based ADC may be adopted in other low-voltage applications. Below, structures of the time-based ADC is further introduced.

Figure 7:
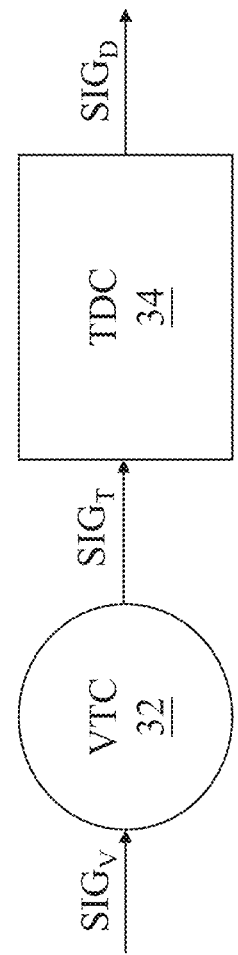
FIG. 7 is a schematic diagram of an ADC in accordance with some embodiments of the present disclosure.

FIG. 7 is a schematic diagram of an ADC 30 in accordance with some embodiments of the present disclosure. The ADC 30 includes a VTC 32 and a TDC 34 coupled to the VTC 32. In some embodiments, the VTC 32 can be same as the VTC 102 (or 103) of the DC-DC controller 100 and the TDC 34 can be same as the TDC 111 (or 112) of the DC-DC controller 100. The VTC 32 is configured to convert a voltage-domain signal $SIG_V$ into a time-domain signal $SIG_T$, and the TDC 34 is configured to convert the time-domain signal $SIG_T$ into a digital-domain signal $SIG_D$.

Figure 8:
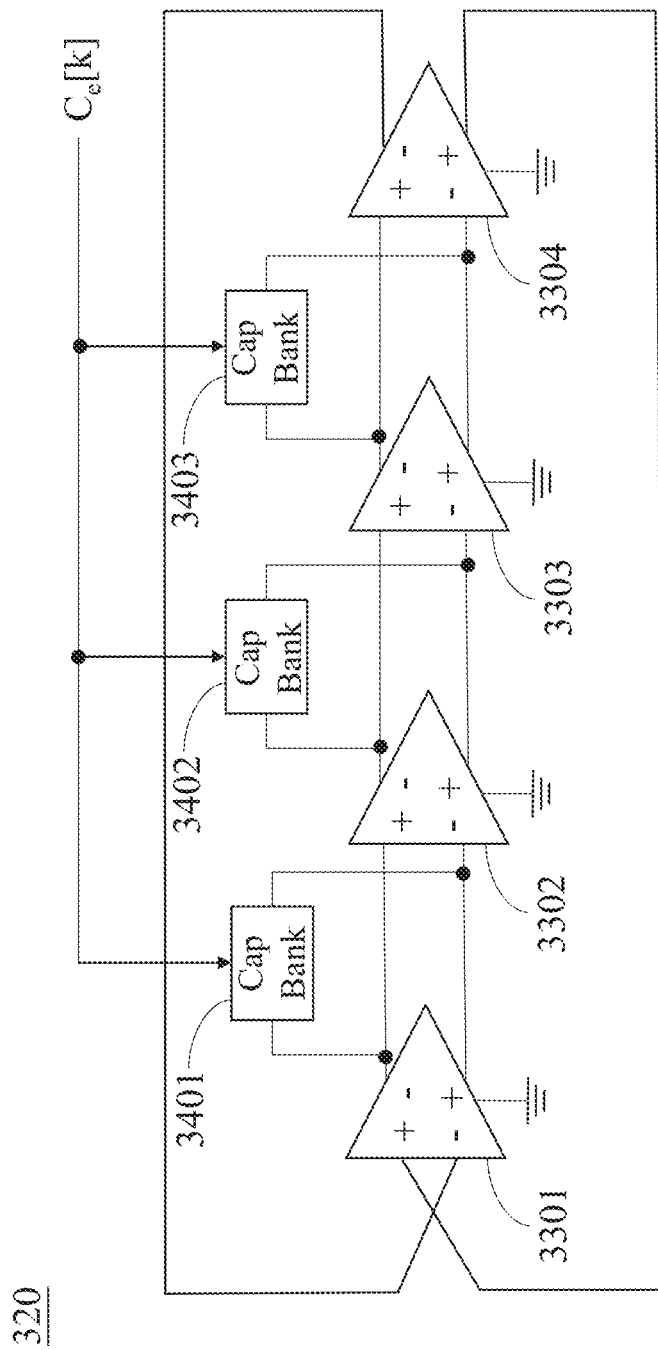
FIG. 8 is a schematic diagram of a VCO in accordance with some embodiments of the present disclosure.

In some embodiments, the VTC 32 may include a voltage-controlled oscillator (VCO) for adjusting the frequency of the time-domain signal $SIG_T$ according to the received voltage-domain signal $SIG_V$. FIG. 8 is a schematic diagram of a VCO 320 in accordance with some embodiments of the present disclosure. In the present embodiment, the VTC 32 may include the VCO 320, and the VCO 320 may include a plurality of delay stages 3301 to 3304 and a plurality of capacitor banks 3401 to 3403. The plurality of capacitor banks 3401 to 3403 are coupled between the plurality of delay stages 3301 to 3304, and may be configured to adjust a frequency of the VCO 320 according to a SAR code $C_e[k]$. In the present embodiment, the VCO 320 is proposed in a four differential delay stage ring oscillator, however, the present disclosure is not limited thereto. For example, in some embodiments, the VCO 320 may omit the delay stage 3301 and the capacitor bank 3401. In such case, the positive input terminal of the delay stage 3302 can be coupled to the negative output terminal of the delay stage 3304 while the negative input terminal of the delay stage 3302 can be coupled to the positive output terminal of the delay stage 3304. Furthermore, in some embodiments, according to the system needs, if one capacitor bank is enough for frequency adjustment, the VCO 320 may include only one capacitor bank instead of a plurality of capacitor banks.

Figure 9:
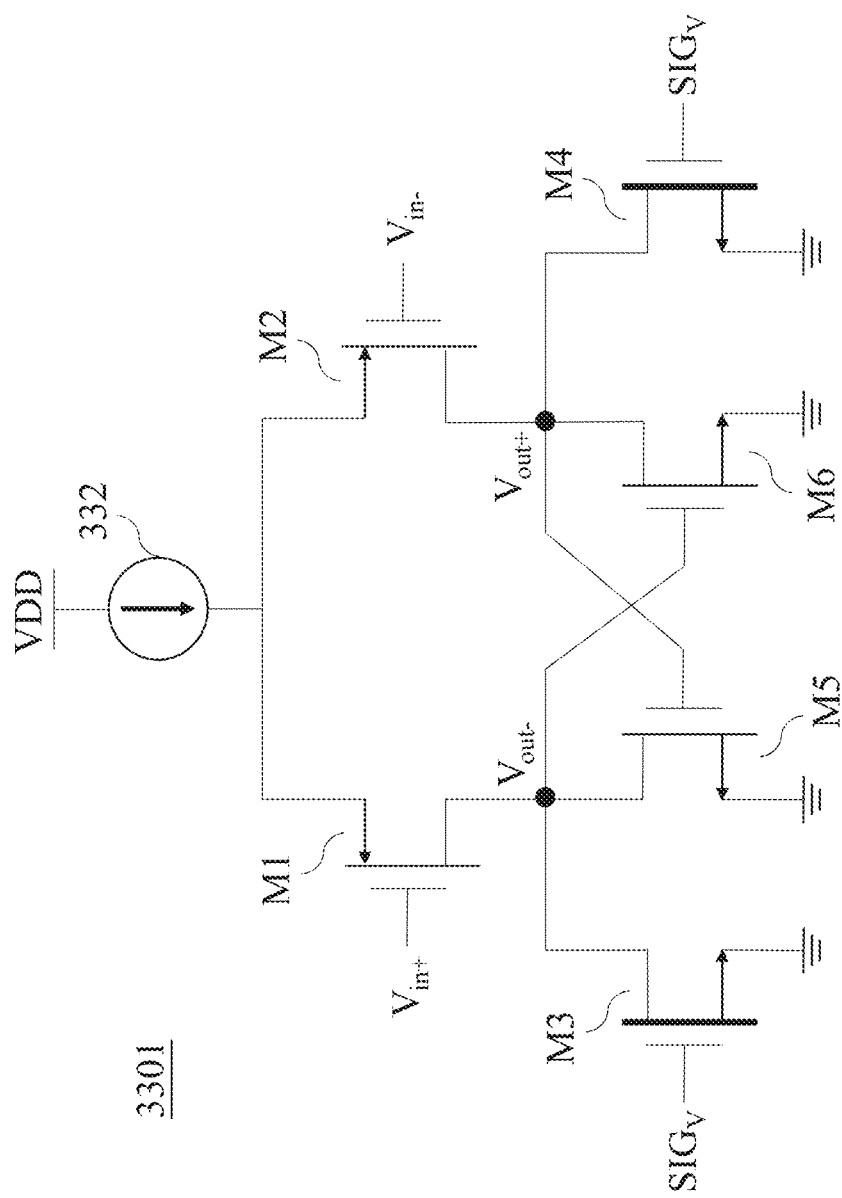
FIG. 9 is a schematic diagram of each of the delay stages in FIG. 7 in accordance with some embodiments of the present disclosure.

FIG. 9 is a schematic diagram of the delay stages 3301 in accordance with some embodiments of the present disclosure. In the present embodiment, the delay stages 3302 to 3304 may have the same structure as the delay stage 3301. As shown in FIG. 9, the delay stage 3301 may include, transistors M1, M2, M3, M4, M5, and M6.

The transistor M1 includes a first terminal coupled to a current source 332, a second terminal configured to output a first output voltage $V_{out-}$ for the next delay stage 3302, and a control terminal configured to receive an input voltage $V_{in+}$. The transistor M2 includes a first terminal coupled to the current source 332, a second terminal configured to output a second output voltage $V_{out+}$ for the next delay stage 3302, and a control terminal configured to receive an input voltage $V_{in-}$. In the present embodiment, the current source 332 can be included in the delay stage 3301, and can be coupled to a supply voltage VDD. However, in some other embodiments, the current source 332 may be disposed external to the delay stage 3301.

The transistor M3 includes a first terminal coupled to the second terminal of the transistor M1, a second terminal configured to receive a ground voltage (i.e., coupled to a ground), and a control terminal configured to receive the voltage-domain signal $SIG_V$. The transistor M4 includes a first terminal coupled to the second terminal of the transistor M2, a second terminal configured to receive the ground voltage, and a control terminal configured to receive the voltage-domain signal $SIG_V$.

The transistor M5 includes a first terminal coupled to the second terminal of the transistor M1, a second terminal configured to receive the ground voltage, and a control terminal coupled to the second terminal of the transistor M2. The transistor M6 includes a first terminal coupled to the second terminal of the transistor M2, a second terminal configured to receive the ground voltage, and a control terminal coupled to the second terminal of the transistor M1

In the present embodiment, the transistors M3 and M4 allow a wider voltage range for the voltage-domain signal $SIG_V$, for example, the voltage swing of the voltage-domain signal $SIG_V$ can be higher than the supply voltage VDD provided for the VCO. In some embodiments, the transistors M3 and M4 can be high-voltage transistors that have thicker gate oxide for enduring higher voltage. In such case, while the supply voltage VDD provided for the VCQ may be 1.8V, the voltage of the voltage-domain signal $SIG_V$ can be in the range of 0V to 3.3 V. As a result, the supply voltage VDD provided for the VCO can be maintained at a lower voltage to reduce the power consumption.

In the present embodiment, capacitance of each of the plurality of capacitor banks 340 can be adjusted. When the VCO 320 is adopted in the VTC 102 of the DC-DC controller 100, the capacitor banks 340 can be controlled by the SAR code $C_e[k]$ generated by the SAR controller 117. By adjusting the capacitances of the capacitor banks 340, a frequency of the VCO 320 can also be adjusted.

In some embodiments, the TDC 34 may include a counter. The counter can convert the time-domain signal $SIG_T$ to a digital-domain signal $SIG_D$ by counting a number of pulses of the time-domain signal $SIG_T$ without referring to any clock signals. In such case, the number of pulses may reflect the frequency of the time-domain signal $SIG_T$, which is also correlated to the voltage of the voltage-domain signal $SIG_V$. As a result, a time-based ADC 30 that can convert low voltage-domain signals into digital domain signals is proposed.

In summary, the DC-DC controller provided by the embodiments of the present disclosure can utilize time-based ADCs to convert analog signals into digital-domain signals, so it can benefit from gate length scaling without limited by the low voltage swing. Also, since the DC-DC controller can adjust the timing of the PWM signals in digital domain with one same control loop, the affection caused by variant PVT can be reduced and the performance degradation caused by circuit mismatch can be prevented. Furthermore, the digital control circuit provided by the embodiments of the present disclosure can be fully synthesizable, which allows implementations in all kinds of digital CMOS processes with a small chip area.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A DC-DC controller, configured to generate N pulse-width modulation (PWM) signals for converting an input voltage to an output voltage targeting at a reference voltage, wherein N is an integer greater than 1, and the DC-DC controller comprises:
a first voltage-to-time converter (VTC), configured to generate a first time-domain signal corresponding to the input voltage;
a second VTC, configured to generate a second time-domain signal corresponding to the output voltage;
a third VTC, configured to generate a third time-domain signal corresponding to the reference voltage;
a digital control circuit, comprising:
a multiplexer selector, configured to determine a voltage interval of the reference voltage according to the first time-domain signal and the third time-domain signal, and accordingly generate N interval indication signals that indicate a time interval in which a falling edge is located for each of the N PWM signals;
a first time-to-digital converter (TDC), coupled to the second VTC, and configured to generate a first digital-domain signal corresponding to the second time-domain signal;
a second TDC, coupled to the third VTC, and configured to generate a second digital-domain signal corresponding to the third time-domain signal;
a sign extractor, configured to generate a comparison code indicating a relation between the output voltage and the reference voltage according to the first digital-domain signal and the second digital-domain signal; and
a first successive approximation register (SAR) controller, configured to generate a first control code according to the comparison code;
a sequential phased signal generator (SPSG), configured to generate N phased signals, wherein the N phased signals have duty cycles of same widths, and frequencies of the N phased signals are (1/N) times a frequency of the third time-domain signal; and
a time-based modulator, configured to adjust the duty cycles of the N phased signals to generate the N PWM signals according to the N interval indication signals and the first control code.

2. The DC-DC controller of claim 1, wherein:
the digital control circuit further comprises a first divider, coupled to the first VTC, and configured to generate a first clock signal by dividing a frequency of the first time-domain signal by a first number; and
the multiplexer selector receives the third time-domain signal and the first clock signal, and generates the N interval indication signals according to a number of pulses of the third time-domain signal that have passed by during a fixed time measured by the first clock signal.

3. The DC-DC controller of claim 2, wherein:
the first divider is further configured to generate a second clock signal by dividing the frequency of the first time-domain signal by a second number;
the first SAR controller receives the second clock signal as a clock signal; and
the first number is equal to or different from the second number.

4. The DC-DC controller of claim 2, wherein:
the digital control circuit further comprises a second divider, the second divider is coupled to the first VTC, and is configured to generate a second clock signal by dividing the frequency of the first time-domain signal with a second number;
the first SAR controller receives the second clock signal as a clock signal; and
the first number is equal to or different from the second number.

5. The DC-DC controller of claim 1, wherein:
after the first SAR controller generates the first control code, the first control code is subtracted by one least significant bit of the first control code;

the first SAR controller is further configured to generate a second control code according to the comparison code for adjusting a timing of the falling edge of each of the N PWM signals;

an adjustment unit of time caused by the first control code is greater than an adjustment unit of time caused by the second control code; and a bit number of the first control code is equal to or different from a bit number of the second control code.

6. The DC-DC controller of claim 1, wherein the first SAR controller is further configured to generate a third control code for controlling at least one capacitor bank of the second VTC so as to calibrate a frequency offset between frequencies of the second time-domain signal and the third time-domain signal.

7. The DC-DC controller of claim 1, wherein the digital control circuit further comprises:

a second SAR controller, configured to generate a second control code according to the comparison code for adjusting a timing of the falling edge of each of the N PWM signals;

wherein after the first SAR controller generates the first control code, the first control code is subtracted by one least significant bit of the first control code before the second SAR controller is activated;

an adjustment unit of time caused by the first control code is greater than an adjustment unit of time caused by the second control code;

a bit number of the first control code is equal to or different from a bit number of the second control code.

8. The DC-DC controller of claim 1, wherein the digital control circuit further comprises:

a third SAR controller, configured to generate a third control code for controlling at least one capacitor bank of the second VTC so as to calibrate a frequency offset between frequencies of the second time-domain signal and the third time-domain signal.

9. The DC-DC controller of claim 1, wherein the digital control circuit further comprises:

an adder, coupled to the first TDC and the second TDC, and configured to generate a digital code according to the first digital-domain signal and the second digital-domain signal; and a code modification unit (CMU), configured to modify a control code received by the time-based modulator according to the digital code so as to regulate the output voltage in at least one of a transient state and a steady state.

10. The DC-DC controller of claim 9, wherein:

if the digital code is greater than a first threshold, the CMU increases the control code received by the time-based modulator so as to increase the duty cycles of the N PWM signals and increase the output voltage in at least one of the transient state and the steady state; and if the digital code is smaller than a second threshold, the CMU decreases the control code received by the time-based modulator so as to decrease the duty cycles of the N PWM signals and decrease the output voltage in at least one of the transient state and the steady state.

11. The DC-DC controller of claim 1, wherein the SPSG comprises:

a phased signal generator (PSG), comprising:

(N−1) D flip-flops (DFFs), wherein each of the (N−1) DFFs comprises a clock terminal configured to receive the third time-domain signal, a data terminal, and an output terminal, wherein an output terminal of a $M^{th}$ DFF of the (N−1) DFFs is coupled to a data terminal of a $(M+1)^{th}$ DFF of the (N−1) DFFs, and M is an integer smaller than (N−1); and a NOR gate, having (N−1) input terminals coupled to output terminals of the (N−1) DFFs, and an output terminal coupled to a data terminal of a $1^{st}$ DFF of the (N−1) DFFs; and N DFFs, configured to output the N phased signals, wherein each of the N DFFs comprises a clock terminal configured to receive the third time-domain signal, a data terminal, and an output terminal, wherein a data terminal of a $K^{th}$ DFF of the N DFFs is coupled to a data terminal of a $K^{th}$ DFF of the (N−1) DFFs in the PSG, K is an integer smaller than N, and a data terminal of an $N^{th}$ DFF of the N DFFs is coupled to an output terminal of an $(N−1)^{th}$ DFF of the (N−1) DFFs in the PSG, and the output terminal of each of the N DFFs outputs each of the N phased signals.

12. The DC-DC controller of claim 1, wherein the time-based modulator comprises:

an input duty selector, configured to generate N pulse signals according to the N phased signals and the N interval indication signals, and combine the N pulse signals into a first combined pulse signal;

at least one digital-to-time converter (DTC), coupled to the input duty selector, and configured to adjust timings of the first combined pulse signal to generate a second combined pulse signal according to at least one control code; and an output duty selector, coupled to the at least one DTC, and configured to generate the N PWM signals according to the second combined pulse signal and the N interval indication signals;

wherein N rising edges of the N PWM signals are determined by the N phased signals, and N falling edges of the N PWM signals are determined by the second combined pulse signal generated by the at least one DTC.

13. The DC-DC controller of claim 12, wherein the input duty selector comprises N input channel units, and a first input channel unit of the N input channel units comprises:

a first multiplexer, configured to select a selected phased signal from the N phased signals according to a first interval indication signal of the N interval indication signals;

a second multiplexer, configured to select the selected phased signal from the N phased signals according to the first interval indication signal;

a pulse generator, coupled to the first multiplexer, and configured to generate a pulse signal corresponding to the selected phased signal, wherein a pulse width of the pulse signal is shorter than a pulse width of the selected phased signal; and a buffer having an input terminal configured to receive the pulse signal, a control terminal configured to receive the selected phased signal, and an output terminal coupled to an input terminal of the at least one DTC and configured to output the pulse signal during an on-time of the selected phased signal.

14. The DC-DC controller of claim 12, wherein the output duty selector comprises N output channel units, a first output channel unit of the N output channel units generates a first PWM signal of the N PWM signals, and the first output channel unit comprises:

a multiplexer, configured to select a selected phased signal from the N phased signals according to a first interval indication signal of the N interval indication signals;

a buffer having an input terminal configured to receive the second combined pulse signal generated by the at least one DTC, a control terminal configured to receive the selected phased signal, and an output terminal configured to output a portion of the second combined pulse signal as a reset signal during an on-time of the selected phased signal; and a D flip-flop (DFF), having a data terminal coupled to a logic high voltage, a clock terminal configured to receive a corresponding phased signal of the N phased signals, a reset terminal configured to receive the reset signal, and an output terminal configured to output the first PWM signal.

15. The DC-DC controller of claim 1, wherein the second VTC and the first TDC form an analog-to-digital converter (ADC) for converting the output voltage into the first digital-domain signal.

16. The DC-DC controller of claim 15, wherein the second VTC comprises a voltage-controlled oscillator (VCO).

17. The DC-DC controller of claim 16, wherein the VCO comprises:
   a plurality of delay stages; and
   at least one capacitor bank, coupled between the plurality of delay stages, and configured to adjust a frequency of the VCO.

18. The DC-DC controller of claim 17, wherein each of the plurality of delay stages comprises:
   a first transistor, having a first terminal coupled to a current source, a second terminal configured to generate a first output voltage for a next delay stage, and a control terminal configured to receive a first input voltage;
   a second transistor, having a first terminal coupled to the current source, a second terminal configured to generate a second output voltage for the next delay stage, and a control terminal configured to receive a second input voltage;
   a third transistor, having a first terminal coupled to the second terminal of the first transistor, a second terminal configured to receive a ground voltage, and a control terminal configured to receive the output voltage;
   a fourth transistor, having a first terminal coupled to the second terminal of the second transistor, a second terminal configured to receive the ground voltage, and a control terminal configured to receive the output voltage;
   a fifth transistor, having a first terminal coupled to the second terminal of the first transistor, a second terminal configured to receive the ground voltage, and a control terminal coupled to the second terminal of the second transistor; and
   a sixth transistor, having a first terminal coupled to the second terminal of the second transistor, a second terminal configured to receive the ground voltage, and a control terminal coupled to the second terminal of the first transistor;
   wherein the output voltage has a voltage swing higher than a supply voltage swing.

19. The DC-DC controller of claim 18, wherein the third transistor and the fourth transistor are high-voltage transistors.

20. The DC-DC controller of claim 15, wherein the first TDC comprises a counter configured to generate the first digital-domain signal by counting a number of pulses of the second time-domain signal.

* * * * *